US009281328B2

(12) United States Patent
Ohno et al.

(10) Patent No.: US 9,281,328 B2
(45) Date of Patent: Mar. 8, 2016

(54) IMAGE SENSOR THAT INCLUDES A BOUNDARY REGION FORMED BETWEEN A LOGIC CIRCUIT REGION AND AN IMAGE-SENSING ELEMENT REGION AND MANUFACTURING METHOD THEREOF

(71) Applicant: Kabushiki Kaisha Toshiba, Tokyo (JP)

(72) Inventors: Hiroshi Ohno, Yokohama (JP); Osamu Fujii, Yokohama (JP); Masataka Shiratsuchi, Kawasaki (JP); Yoshinori Honguh, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 401 days.

(21) Appl. No.: 13/737,079

(22) Filed: Jan. 9, 2013

(65) Prior Publication Data
US 2013/0221196 A1 Aug. 29, 2013

(30) Foreign Application Priority Data

Feb. 29, 2012 (JP) ................................. 2012-043393

(51) Int. Cl.
*H01L 27/00* (2006.01)
*H01J 40/14* (2006.01)
*H01L 27/146* (2006.01)
(Continued)

(52) U.S. Cl.
CPC ........ *H01L 27/14601* (2013.01); *H01L 27/146* (2013.01); *H01L 27/1463* (2013.01); *H01L 27/14683* (2013.01); *H04N 5/335* (2013.01); *H04N 5/369* (2013.01); *H01L 27/14643* (2013.01)

(58) Field of Classification Search
USPC ............... 250/208.1, 214 R, 214.1, 216, 226; 348/272–283, 294–324, 332, 333.08, 348/335–338; 257/291–294, 414, 431–466; 438/57–98, 144–148
See application file for complete search history.

(56) References Cited

U.S. PATENT DOCUMENTS 7,285,482 B2 * 10/2007 Ochi .............................. 438/527
8,101,974 B2 1/2012 Ohno et al.
2010/0085073 A1 * 4/2010 Lagowski et al. ............. 324/765
(Continued)

FOREIGN PATENT DOCUMENTS

JP 2000-196055 A 7/2000
JP 2009-128539 6/2009
(Continued)

OTHER PUBLICATIONS

"Diffusion Length". pveducation.org. http://www.pveducation.org/pvcdrom/pn-junction/diffusion-length.*
(Continued)

*Primary Examiner* — Pascal M Bui Pho
(74) *Attorney, Agent, or Firm* — Oblon, McClelland, Maier & Neustadt, L.L.P.

(57) ABSTRACT

According to one embodiment, an image sensor includes an image-sensing element region formed by arranging a plurality of image-sensing elements on a semiconductor substrate and element isolation portions formed to isolate the image-sensing elements, and a logic circuit region formed in a region different from the image-sensing element region on the substrate and including a plurality of gate patterns. Further, dummy element isolation portions are arranged with a constant pitch in the boundary region between the image-sensing element region and the logic circuit region.

18 Claims, 3 Drawing Sheets

(51) Int. Cl.
*H04N 5/335* (2011.01)
*H04N 5/369* (2011.01)

(56) References Cited

U.S. PATENT DOCUMENTS

| | | | |
|---|---|---|---|
| 2010/0214457 A1* | 8/2010 | Sakai | 348/294 |
| 2010/0301444 A1 | 12/2010 | Koike | |
| 2011/0233685 A1 | 9/2011 | Ito et al. | |
| 2011/0316052 A1 | 12/2011 | Furuta et al. | |
| 2013/0221196 A1* | 8/2013 | Ohno et al. | 250/208.1 |

FOREIGN PATENT DOCUMENTS

| | | |
|---|---|---|
| JP | 2010-278232 A | 12/2010 |
| JP | 2011-155248 A | 8/2011 |
| JP | 2011-205049 A | 10/2011 |
| JP | 2011-222747 A | 11/2011 |
| JP | 2012-9588 A | 1/2012 |

OTHER PUBLICATIONS

Hiroshi Ohno et al. "Optical Interference Effect on Chip's Temperature Distribution in the Optical Annealing Process", 16$^{th}$ IEEE International Conference on Advanced Thermal Processing of Semiconductors—rtp2008, pp. 1-4.

Hirofumi Sumi et al. "For the Better Image Quality of CMOS Image Sensor", Fundamentals Review, vol. 3 No. 3 2010, pp. 44-51.

Office Action issued Feb. 3, 2015 in Japanese Patent Application No. 2012-043393 (with English language translation).

Office Action issued Sep. 15, 2015 in Japanese Patent Application No. 2012-043393 (with English language translation).

* cited by examiner

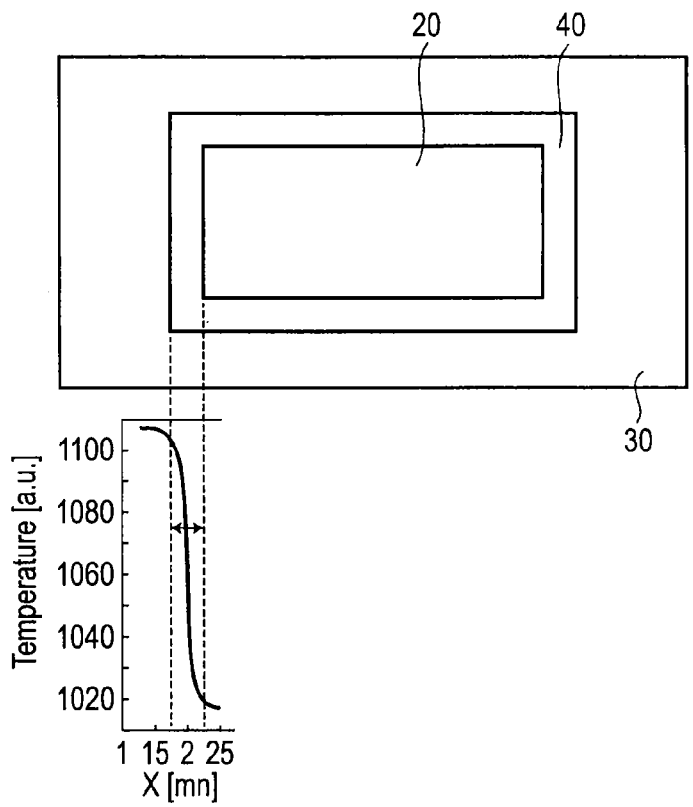
F I G. 5
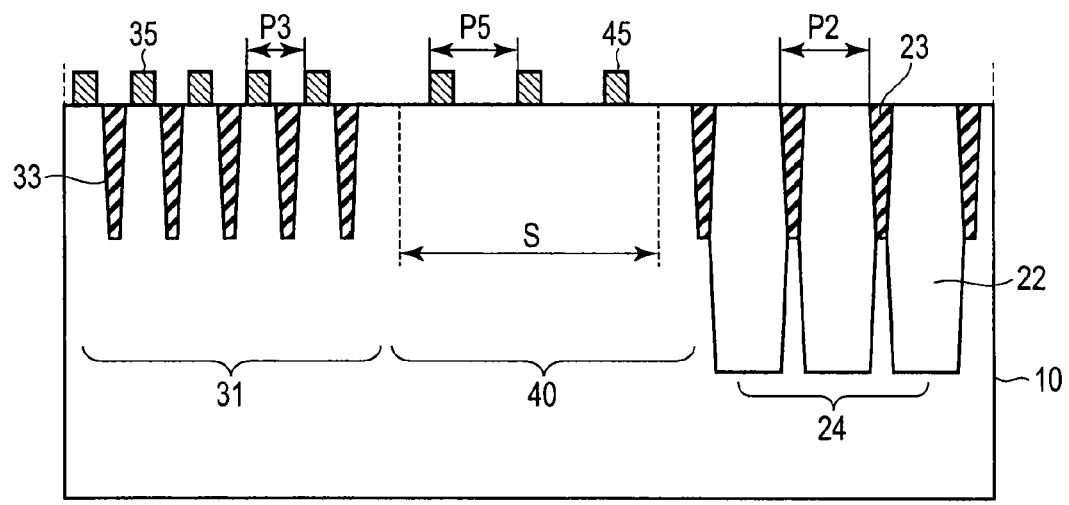
F I G. 6

IMAGE SENSOR THAT INCLUDES A BOUNDARY REGION FORMED BETWEEN A LOGIC CIRCUIT REGION AND AN IMAGE-SENSING ELEMENT REGION AND MANUFACTURING METHOD THEREOF

CROSS-REFERENCE TO RELATED APPLICATIONS

This application is based upon and claims the benefit of priority from Japanese Patent Application No. 2012-043393, filed Feb. 29, 2012, the entire contents of which are incorporated herein by reference.

FIELD

Embodiments described herein relate generally to an image sensor including an image-sensing element region and logic circuit region and a manufacturing method thereof.

BACKGROUND

A CMOS image sensor has image-sensing elements configured to acquire an image signal from a subject and a logic circuit configured to perform an image processing operation that can be incorporated on the same chip by use of the same manufacturing process. This is effective in providing a compact structure. However, in the CMOS image sensor, the mean pitches of circuit patterns in an image-sensing element region and logic circuit region are different in the order of digits. Due to this, a problem that the quality of the image-sensing element is degraded tends to occur.

That is, since the mean pitches of the circuit patterns in the respective regions are greatly different, it is predicted that the temperature of the logic circuit region becomes higher than that of the image-sensing element region in an optical annealing process that is one of the manufacturing processes. This is because the pitch of gate conductors (GCs), which are circuit patterns of the logic circuit, is smaller than the incident wavelength and the light absorption rate becomes higher in comparison with that in the image-sensing element region.

If the temperature of the logic circuit region becomes higher than that of the image-sensing element region, heat transfers from the logic circuit region to the image-sensing element region due to thermal diffusion in a portion of the image-sensing element region that is close to the logic circuit region. As a result, temperature irregularities occur in the peripheral region of the image-sensing element region. Such temperature irregularities cause a variation in the characteristic of each image-sensing element and lead to degradation in the quality.

BRIEF DESCRIPTION OF THE DRAWINGS

FIG. 5 is a characteristic diagram showing the temperature distribution obtained when the structure of FIG. 3 is subjected to optical annealing.

FIG. 6 is a cross-sectional view showing the structure of an image-sensing element region, logic circuit region and boundary region used in a CMOS image sensor of a second embodiment.

DETAILED DESCRIPTION

In general, according to one embodiment, an image sensor includes an image-sensing element region formed by arranging a plurality of image-sensing elements on a semiconductor substrate and element isolation portions formed to isolate the image-sensing elements, and a logic circuit region formed in a region different from the image-sensing element region on the substrate and including a plurality of gate patterns. Further, dummy element isolation portions are arranged with a constant pitch in the boundary region between the image-sensing element region and the logic circuit region.

The present embodiment is explained below with reference to the drawings.

First Embodiment

Figure 1:
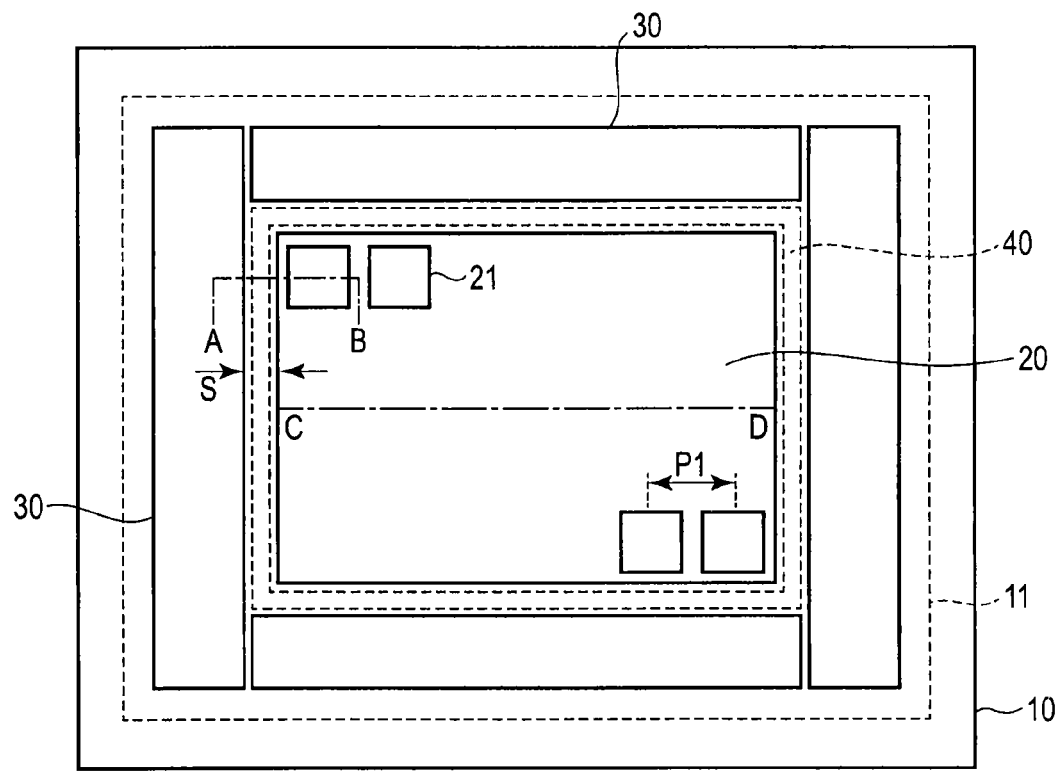
FIG. 1 is a top view of a chip showing an example of the circuit arrangement in a CMOS image sensor according to a first embodiment.

FIG. 1 is a plan view showing an example of the circuit arrangement in a CMOS image sensor according to a first embodiment. In FIG. 1, only one chip 11 that is one of a plurality of chips formed on a semiconductor substrate 10 is shown.

An image-sensing element region 20 is arranged on the semiconductor substrate 10 formed of Si or the like and a plurality of logic circuit regions 30 are arranged to surround the above region. Further, a boundary region 40 is arranged between the image-sensing element region 20 and the logic circuit regions 30. The total size of one chip 11 is 10 mm×10 mm, for example. In the image-sensing element region 20, a plurality of image-sensing elements 21 are two-dimensionally arranged side by side at equal intervals. For example, the shape of the area of the image-sensing element 21 is a square with one side set to 5 μm. The distance between the centers of the image-sensing elements 21 is called pitch P1 of the image-sensing elements 21. Pitch P1 of the image-sensing elements 21 is set to 5.2 μm, for example.

Figure 2:
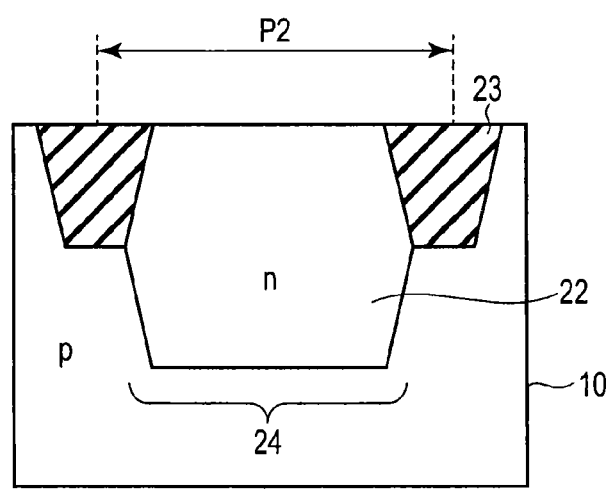
FIG. 2 is a cross-sectional view showing the structure of an image-sensing element region used in the CMOS image sensor of FIG. 1.

The basic structure of the image-sensing element 21 is shown in the cross-sectional view of FIG. 2. That is, the image-sensing element 21 includes shallow trench isolation (STI: Element Isolation) portions 23 formed of silicon oxide or the like and a photodiode 24 in the semiconductor substrate 10. For example, the semiconductor substrate 10 is of a p type. In the photodiode portion 24, an n type region 22 is formed in the surface portion of the substrate 10. The STI portions 23 are arranged at constant intervals. The distance between the centers of the adjacent STI portions 23 or the distance between the left-side surfaces thereof is called pitch P2 of the STI portions 23. The pitch is equal to pitch P1 of the image-sensing elements 21 and is set to 5.2 μm.

Figure 3:
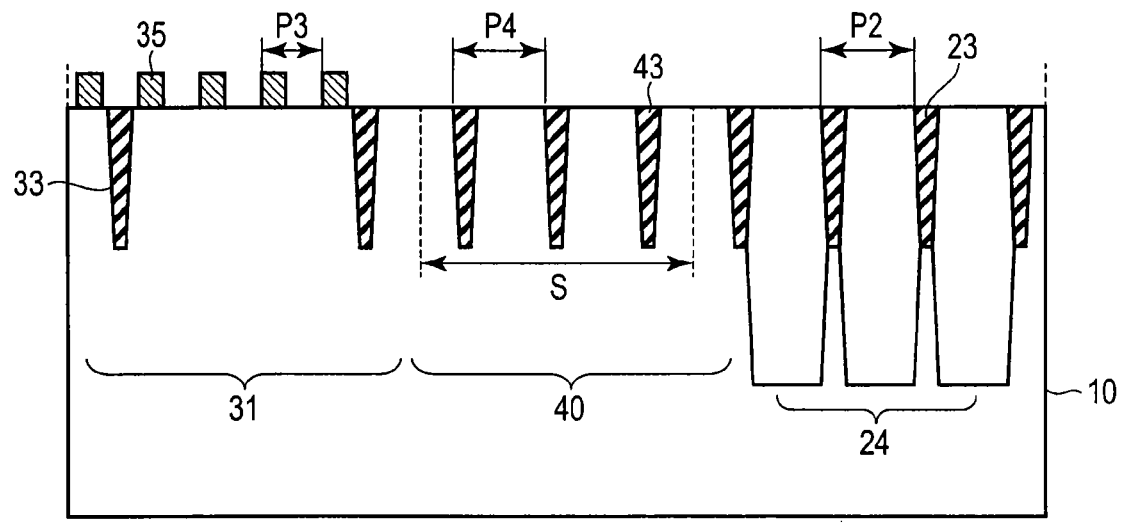
FIG. 3 is a cross-sectional view showing the structure of the image-sensing element region, logic circuit region and boundary region used in the CMOS image sensor of FIG. 1.

The cross section taken along the line passing through A and B in the plan view of FIG. 1 is shown in FIG. 3. A logic circuit region 31 (a portion of the logic circuit region 30) includes STI (element isolation) portions 33, GCs (gate patterns) 35 and circuit elements (diffusion layers or the like used for formation of various circuits) (not shown). The GCs 35 are arranged at equal intervals. The interval between the adjacent GCs, more specifically, the distance between the centers of the adjacent GCs or the distance between the left-side surfaces of the adjacent GCs is called pitch P3 of the GCs. It is general to set pitch P3 of the GCs 35 in a range of 10 to 100 nm. However, pitch P3 of the GCs 35 is not necessarily set to an equal interval and GCs 35 having various pitches may be provided together. In this case, the mean value of the pitches is called pitch P3 of the GCs. In this example, it is supposed that pitch P3 of the GCs 35 is set to 50 nm, for example.

The boundary region 40 having constant boundary width S is provided between the logic circuit region 30 and the image-sensing element region 20. It is supposed that boundary width S is set equal to or larger than thermal diffusion length L of flash lamp annealing (FLA). In this case, L can be expressed by the following equation if the annealing time is t and the temperature diffusion rate (thermal diffusivity) of silicon is $\alpha$.

$$L=(\alpha t)^{1/2}$$

If annealing time t is set to 1 ms, L becomes approximately 200 μm at the normal temperature (25° C.), for example.

In the boundary region 40, dummy STI (element isolation) portions 43 are formed at a constant pitch. Pitch P4 of the dummy STI portions 43 is set to the same value as pitch P2 of the STI portions 23 of the image-sensing element region 20. That is, pitch P4 of the dummy STI portions is set to 5.2 μm in this embodiment. Further, a material of the dummy STI portion 43 is the same as that of the STI portion 23.

In the manufacturing method of the CMOS image sensor of this embodiment, first, STI portions 23, 33 formed of silicon oxide or the like are formed to surround the respective element regions in an image-sensing element region 20 and logic circuit regions 30 of a substrate 10 and, at the same time, STI portions 43 are formed in a boundary region 40. Then, impurities used for formation of n type regions are ion-implanted into the image-sensing element region 20. Here the impurities are not ion-implanted into the boundary region 40. Next, a poly Si film is formed on the entire surface with a gate insulating film disposed therebetween and is then processed to form GCs 35 in the logic circuit region 30. Subsequently, impurities used for formation of CMOS transistors are ion-implanted into the logic circuit region 30.

The structure shown in FIG. 3 is obtained by the process up to the above step. For formation of the dummy STI portions 43, it is only necessary to add a dummy STI pattern to an exposure mask including an STI pattern. Therefore, a new process for forming the dummy STI portions 43 is not required.

Next, the diffusion layers or the like formed in the image-sensing element region 20 and logic circuit regions 30 are activated by subjecting the substrate surface portion to heat treatment by using an optical annealing apparatus that will be described later. After this, necessary interconnections are formed after an interlayer insulating film is formed on the substrate surface, which completes a CMOS image sensor.

Figure 4:
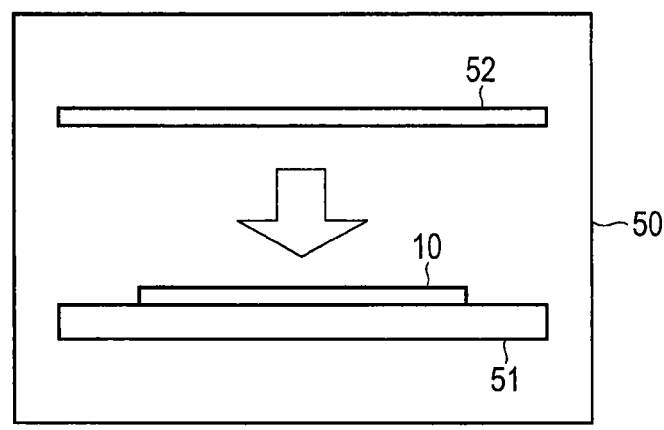
FIG. 4 is a cross-sectional view showing the schematic configuration of an optical annealing apparatus used for manufacturing the CMOS image sensor of the first embodiment.

FIG. 4 is a schematic configuration view showing an optical annealing apparatus used for manufacturing the CMOS image sensor of this embodiment.

A susceptor 51 used for placing the semiconductor substrate 10 thereon and a light source 52 for applying light to the surface of the substrate 10 are disposed in a chamber 50. The period of illumination of light by means of the light source 52 is set to several seconds or less. In the above light illumination condition, the surface temperature of the semiconductor substrate 10 instantly reaches a high temperature and the surface portion thereof is annealed.

As the optical annealing process, FLA is used. At this time, for example, it is supposed that the light source 52 is a xenon lamp or has an intensity spectrum equivalent to that of a xenon lamp. A xenon lamp has an intensity spectrum between 6000 K and 6500 K at a temperature of black body radiation, but the wavelength of the spectrum is set to $\lambda$ (for example, 450 nm) in the following description. Further, for example, the illumination period is set to several ms and does not exceed 1 second. In this example, it is set to 1 ms, for example.

Next, the operation and effect of this embodiment are explained.

In the manufacturing process of the CMOS image sensor, it is necessary to perform an annealing process to activate the diffusion layer. This embodiment is featured in that the annealing process is performed in the state of FIG. 3.

In FIG. 3, the STI portion 23 of the image-sensing element region 20 is formed of silicon oxide, for example. The complex index of refraction of silicon oxide is different from that of silicon. Therefore, the light absorption rate of the image-sensing element region 20 is calculated to be higher by 10 to 20% in comparison with the light absorption rate of the semiconductor substrate 10 formed of only silicon. Incidentally, the light absorption rate of the semiconductor substrate 10 formed of silicon becomes approximately 58% when calculated by the rigorous coupled wave analysis (RCWA) method.

Since the dummy STI portions 43 are formed in the boundary region 40 and the dummy STI portion 43 is formed of the same material as the STI portion 23, both portions have the same complex index of refraction. Further, since the complex indices of refraction of the n type region 22 and semiconductor substrate 10 are almost equal to each other and pitch P4 of the dummy STI portions 43 and pitch P3 of the STI portions 23 are almost equal to each other, the distributions of the complex indices of refraction in the boundary region 40 and image-sensing element region 20 are equal to each other. As a result, the light absorption rates of the boundary region 40 and image-sensing element region 20 are equal to each other. That is, the light absorption rate becomes uniform in both of the boundary region 40 and image-sensing element region 20.

However, it is general in the logic circuit region 30 for pitch P3 of the GCs 35 to be extremely narrow and the light absorption rate becomes higher by approximately several 10% in comparison with that of the image-sensing element region 20. Further, the light absorption rate depends on pitch P3 of the GCs 35. However, in the logic circuit region 30, circuits comprise unified circuit groups and are separately arranged in some cases. That is, the respective circuit groups with pitch P3 are dispersedly arranged in some cases. In this case, the mean light absorption rate of the logic circuit region 30 happens to become lower than that of the image-sensing element region 20. Further, when the pitch of the STI portions 33 of the logic circuit region 30 is much larger than the pitch of the STI portions 23 of the image-sensing element region 20, the light absorption rate of the dense area (the circuit group with the GCs 35) in the logic circuit region 30 is only increased. At this time, if the pitch of the GCs 35 is also large, there occurs a possibility that the light absorption rate of the logic circuit region 30 may become smaller than that of the image-sensing element region 20.

As described above, generally, it is considered that the light absorption rate of the logic circuit region 30 is different from the light absorption rates of both of the boundary region 40 and image-sensing element region 20. As a result, it is considered that the temperature of the logic circuit region 30 is different from the temperatures of both regions of the boundary region 40 and image-sensing element region 20.

At this time, if the temperature of the logic circuit region 30 is higher than the temperature of the boundary region 40, heat transfers to the boundary region 40 due to thermal diffusion. However, since boundary width S is set equal to or larger than thermal diffusion length L, heat that is transferred into the boundary region 40 does not reach the image-sensing element region 20. This is because the heat absorption rate of the boundary region 40 is equal to the heat absorption rate of the image-sensing element region 20. Further, if the temperature of the logic circuit region 30 is lower than the temperature of the boundary region 40, heat escapes from the boundary region 40 to the logic circuit region 30 due to thermal diffusion. However, since boundary width S is set equal to or larger than thermal diffusion length L, heat is discharged only from the boundary region 40 and is hardly discharged from the image-sensing element region 20.

In practice, the calculation result of the temperature distribution in the plane of the chip 11 is shown in FIG. 5 and the temperature distribution of a boundary region 40 that passes through A and B is plotted. The abscissa indicates a position on AB and the ordinate indicates a temperature. As shown in FIG. 5, it is understood that the temperature varies only in the boundary region 40 and the temperature is kept substantially uniform in the image-sensing element region 20. Thus, the temperature can be kept constant in the image-sensing element region 20 and temperature irregularities can be reduced.

In this embodiment, the dummy STI portions 43 are formed in the boundary region 40 between the image-sensing element region 20 and the logic circuit region 30 and pitch P4 of the dummy STI portions 43 is set equal to pitch P2 of the STI portions 23 of the image-sensing element region 20. As a result, temperature irregularities in the image-sensing element region 20 can be reduced. Therefore, a variation in the element characteristic caused by temperature irregularities can be suppressed and the product quality can be enhanced. Since the dummy STI portions 43 can be formed at the same time as formation of the STI portions 23 of the image-sensing element region 20, it is not necessary to newly add a manufacturing process.

Further, as a method for reducing temperature irregularities in the image-sensing element region 20, it is considered to form fine rough portions on the surface of an image-sensing element by X-ray lithography to form a reflection-preventing structure. However, if a reflection-preventing film structure is provided by X-ray lithography, the manufacturing cost and manufacturing time are increased. Further, in the X-ray lithography, it is difficult to control the thickness of rough portions and it is difficult to form rough portions having an optimum thickness. On the other hand, in this embodiment, since it is only required to form the dummy STI portions 43 at the same time as formation of the STI portions 23, 33 without providing a new process, the manufacturing cost and manufacturing time will not be increased.

Second Embodiment

FIG. 6 is a cross-sectional view showing the structure of an image-sensing element region, logic circuit region and boundary region used in a CMOS image sensor of a second embodiment. Portions that are the same as those of FIG. 3 are denoted by the same symbols and a detailed explanation thereof is omitted.

This embodiment is different from the first embodiment in that dummy GCs (dummy gate patterns) 45 are provided instead of providing the dummy STI portions 43 in the boundary region 40. That is, the dummy GCs 45 that are formed of the same material as the GC 35 are arranged at equal intervals on the surface of the boundary region 40. It is supposed that pitch P5 of the dummy GCs 45 is sufficiently larger than pitch P3 of the GCs 35 in the logic circuit region 30. The dummy GCs 45 are not connected to any circuit element and are made to float.

The light absorption rate can be raised by providing GCs on the substrate and narrowing the pitch of the GCs. Therefore, the light absorption rate in the boundary region 40 can be raised and set equal or close to the light absorption rate in the image-sensing element region 20 by providing the dummy GCs 45 in the boundary region 40 and setting pitch P5 thereof larger than the pitch of the GCs 35.

If pitch P5 of the dummy GCs 45 is set equal to pitch P3 of the GCs 35, the light absorption rate in the boundary region 40 becomes equal to the light absorption rate in the logic circuit region 30. In this case, temperature irregularities in the image-sensing element region 20 cannot be prevented although temperature irregularities in the logic circuit region can be prevented. If the light absorption rate in the boundary region 40 is set equal to the light absorption rate in the image-sensing element region 20, temperature irregularities in the image-sensing element region 20 can be prevented although temperature irregularities occur in the logic circuit region. Temperature irregularity in the logic circuit region 30 does not develop into a serious problem and temperature irregularity in the image-sensing element region 20 gives a great influence to the element characteristic. Therefore, it is important to set the light absorption rate in the boundary region 40 equal to the light absorption rate in the image-sensing element region 20.

Thus, according to this embodiment, the temperature difference between the image-sensing element region 20 and the boundary region 40 can be made small in optical annealing by providing the GCs 45 in the boundary region 40. Therefore, temperature irregularities in the image-sensing element region 20 can be reduced, a variation in the element characteristic can be suppressed and the product quality can be enhanced. Further, since the dummy GCs 45 can be formed at the same time as formation of the GCs 35 of the logic circuit region 30, it is not necessary to newly provide a manufacturing process.

Modification

This invention is not limited to the above embodiments. The optical annealing apparatus is not limited to the structure shown in FIG. 4 and any apparatus can be used if it can realize optical annealing with several ms. Further, the annealing method is not limited to FLA and laser spike annealing (LSA) can also be used.

In the above embodiment, the pitch of the dummy element isolation portions in the boundary region is set equal to the pitch of the element isolation portions in the image-sensing element region, but it is not necessary to set the pitches strictly equal to each other. It is most desirable to set the pitches to the same value, but it is possible to attain an effect of setting the light absorption rates in the boundary region and image-sensing element region close to each other as long as the pitch of the dummy element isolation portions does not greatly differ from the pitch of the element isolation portions of the image-sensing element region.

Further, in the above embodiment, an example applied to the CMOS image sensor is explained, but it is not limited to the CMOS image sensor. For example, an image sensor having an image-sensing element region and logic circuit region arranged on the same chip can be similarly applied. Further, the logic circuit region is not necessarily formed to surround the peripheral portion of the image-sensing element region and is sufficient if it is arranged close to the image-sensing element region.

Further, the manufacturing methods for the respective portions of the image-sensing element region and logic circuit region are not restricted at all and an optical annealing process may be performed in a state in which the image-sensing element region, the logic circuit region and the dummy element isolation portions of the boundary region are formed as shown in FIG. 3. Alternatively, an optical annealing process may be performed in a state in which the image-sensing element region, the logic circuit region and the dummy gate patterns of the boundary region are formed as shown in FIG. 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image sensor comprising:
   a semiconductor substrate;
   a logic circuit region, formed on the substrate, including a plurality of gate patterns;
   an image-sensing element region formed in a region different from the logic circuit region on the substrate, the image-sensing element region including a plurality of image-sensing elements and element isolation portions for isolating the image-sensing elements; and
   a boundary region formed between the logic circuit region and the image-sensing element region, dummy element isolation portions being arranged at a preset pitch in the boundary region, wherein
   the boundary region has a boundary width not smaller than a thermal diffusion length of annealing for the substrate.

2. The image sensor of claim 1, wherein the pitch of the dummy element isolation portions is equal to a pitch of the element isolation portions in the image-sensing element region.

3. The image sensor of claim 1, wherein the thermal diffusion length is defined as $$L=(\alpha t)^{1/2}$$

where an annealing time is t and a thermal diffusivity of the semiconductor substrate is $\alpha$.

4. The image sensor of claim 1, wherein the logic circuit region is formed to surround the image-sensing element region.

5. An image sensor comprising:
   a semiconductor substrate;
   a logic circuit region, formed on the substrate, including a plurality of gate patterns;
   an image-sensing element region formed in a region different from the logic circuit region on the substrate, a plurality of image-sensing elements being formed in the image-sensing element region; and
   a boundary region formed between the logic circuit region and the image-sensing element region, dummy gate patterns being arranged at a preset pitch in the boundary region, wherein
   the boundary region has a boundary width not smaller than a thermal diffusion length of annealing for the substrate.

6. The image sensor of claim 5, wherein the pitch of the dummy gate patterns is larger than a pitch of the gate patterns of the logic circuit region.

7. The image sensor of claim 5, wherein the thermal diffusion length is defined as $$L=(\alpha t)^{1/2}$$

where an annealing time is t and a thermal diffusivity of the semiconductor substrate is $\alpha$.

8. The image sensor of claim 5, wherein the logic circuit region is formed to surround the image-sensing element region.

9. The image sensor of claim 5, wherein the dummy gate patterns have the same structure as the gate patterns of the logic circuit region, but do not contribute to a circuit operation.

10. An image sensor manufacturing method comprising:
    forming an image-sensing element region having a plurality of image-sensing elements formed therein and element isolation portions used for isolating the image-sensing elements on a semiconductor substrate;
    forming a logic circuit region including a plurality of gate patterns in a region different from the image-sensing element region on the substrate;
    forming dummy pattern portions at a constant pitch in a boundary region between the image-sensing element region and the logic circuit region, a width of the boundary region being set not smaller than a thermal diffusion length of annealing for the semiconductor substrate; and
    subjecting the substrate to an optical annealing process after the image-sensing element region, the logic circuit region and the dummy pattern portions are formed.

11. The method of claim 10, wherein the forming the dummy pattern portions is forming dummy element isolation portions in the boundary region.

12. The method of claim 11, wherein the dummy element isolation portions are formed of the same material as the element isolation portions of the image-sensing element region and are formed at the same time as formation of the element isolation portions.

13. The method of claim 11, wherein the optical annealing process is one of FLA and LSA.

14. The method of claim 11, wherein the thermal diffusion length L in the annealing process is defined as $$L=(\alpha t)^{1/2}$$

where an annealing time for the substrate is t and a thermal diffusivity of the semiconductor substrate is $\alpha$.

15. The method of claim 10, wherein the forming the dummy pattern portions is forming dummy gate patterns on the boundary region between the image-sensing element region and the logic circuit region.

16. The method of claim 15, wherein the dummy gate patterns are formed of the same material as the gate patterns of the logic circuit region and are formed at the same time as formation of the gate patterns of the logic circuit region.

17. The method of claim 15, wherein the optical annealing process is one of FLA and LSA.

18. The method of claim 15, wherein the thermal diffusion length L in the annealing process is defined as $$L=(\alpha t)^{1/2}$$

where an annealing time for the substrate is t and a thermal diffusivity of the semiconductor substrate is $\alpha$.

* * * * *